United States Patent
Stehning et al.

(10) Patent No.: US 10,274,562 B2
(45) Date of Patent: Apr. 30, 2019

(54) MR-BASED ATTENUATION CORRECTION IN PET/MR IMAGING WITH DIXON PULSE SEQUENCE

(71) Applicant: KONINKLIJKE PHILIPS N.V., Eindhoven (NL)

(72) Inventors: Christian Stehning, Hamburg (DE); Holger Eggers, Ellerhoop (DE); Peter Bornert, Hamburg (DE); Lingzhi Hu, Cleveland, OH (US); Zhiqiang Hu, Twinsburg, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 470 days.

(21) Appl. No.: 14/916,297

(22) PCT Filed: Sep. 18, 2014

(86) PCT No.: PCT/EP2014/069910
§ 371 (c)(1),
(2) Date: Mar. 3, 2016

(87) PCT Pub. No.: WO2015/040120
PCT Pub. Date: Mar. 26, 2015

(65) Prior Publication Data
US 2016/0202334 A1    Jul. 14, 2016

Related U.S. Application Data

(60) Provisional application No. 61/881,018, filed on Sep. 23, 2013.

(30) Foreign Application Priority Data
Oct. 23, 2013    (EP) ................................ 13189802

(51) Int. Cl.
*G01R 33/48*    (2006.01)
*G01R 33/561*    (2006.01)
*G01R 33/56*    (2006.01)

(52) U.S. Cl.
CPC ....... *G01R 33/481* (2013.01); *G01R 33/4816* (2013.01); *G01R 33/4828* (2013.01);
(Continued)

(58) Field of Classification Search
None
See application file for complete search history.

(56) References Cited

U.S. PATENT DOCUMENTS

2001/0031242 A1* 10/2001 Cremillieux ....... G01R 33/5601
424/9.36
2004/0010191 A1* 1/2004 Yatsui ................. A61B 5/4872
600/410
(Continued)

FOREIGN PATENT DOCUMENTS

| WO | 2010/113048 | 10/2010 |
|----|-------------|---------|
| WO | 2013/001399 | 1/2013 |
| WO | 2014/161766 | 10/2014 |

OTHER PUBLICATIONS

Berker "MRI-based attenuation correction for hybrid PET/MRI Systems: A 4-class tissue segmentation technique using a combined ultrashort-echo-time/Dixon MRI sequence", Journal of Nuclear Medicine, vol. 53, No. 5, Apr. 13, 2012.
(Continued)

*Primary Examiner* — Jermele M Hollington
*Assistant Examiner* — Suresh K Rajaputra

(57) ABSTRACT

A medical imaging system (10) includes a nuclear imaging system (62), a timing optimization unit (40), a magnetic resonance (MR) scanner (12), an MR reconstruction unit (38), and an attenuation map unit (50). The nuclear imaging system (62) receives nuclear decay data and generates at
(Continued)

least one nuclear image (64) of a first resolution based on the received nuclear decay data of an imaged subject (16) and an attenuation map (52). The timing optimization unit (40) which selects a first and a second echo time for a modified Dixon (mDixon) pulse sequence and a sufficient number of repetition times (TRs) to generate an image of the subject (16) of at least a first resolution, with the phase angle difference between water and fat at the first and the second echo time being unequal to 0° and 180°. The MR scanner (12) applies the sequence to the subject (16) and receives MR data (32) from the subject. The MR reconstruction unit (38) reconstructs at least one MR image (44) based on the MR data (32). The attenuation map unit (50) constructs the attenuation map (52) based on the reconstructed MR image (44).

20 Claims, 2 Drawing Sheets

(52) U.S. Cl.
CPC ..... *G01R 33/5608* (2013.01); *G01R 33/5615* (2013.01); *G01R 33/5616* (2013.01)

(56) References Cited

U.S. PATENT DOCUMENTS

| | | | |
|---|---|---|---|
| 2010/0052674 | A1 | 3/2010 | Jellus |
| 2013/0281825 | A1* | 10/2013 | Thiruvenkadam ......................... G01R 33/56383 600/411 |

OTHER PUBLICATIONS

Johan Berglund et al: "Two-point Dixon Method With Flexible Echo Times", Magnetic Resonance in Medicine, 2010 Wiley-Liss, Inc, vol. 65, No. 4, Nov. 16, 2010.

Holger Eggers et al: "Dual-Echo Dixon Imaging with Flexible Choice of EchoTimes", Magnetic Resonance in Medicine, 2010 Wiley-Liss, Inc, vol. 65, No. 1, Sep. 21, 2010.

Kang Wang et al: "k-space water-fat decomposition with T2* estimation and multifrequency fat spectrum modeling for ultrashort echo time imaging". Journal of Magnetic Resonance Imaging, vol. 31, No. 4, Mar. 29, 2010.

Matthias Eiber et al: "Value of a Dixon-based MR/PET attenuation correction sequence for the localization and evaluation of PET-positive lesions". European Journal of Nuclear Medicine and Molecular Imaging, Springer, Berlin, DE, vol. 38, No. 9, Jun. 18, 2011.

Zaidi Habib et al: "An outlook on future design of hybrid PET/MRI systems", Medical Physics, AIP, Melville, NY, US, vol. 38, No. 10, Sep. 26, 2011.

C. Catana et al: "Toward Implementing an MRI-Based PET Attenuation-Correction Method for Neurologic Studies on the MR-PET Brain Prototype", The Journal of Nuclear Medicine, vol. 51, No. 9, Sep. 1, 2010.

M. Hofmann et al: "MRI-Based Attenuation Correction for Whole-Body PET/MRI: Quantitative Evaluation of Segmentation-and Atlas-Based Methods",The Journal of Nuclear Medicine, vol. 52, No. 9, Aug. 9, 2011.

Reeder et al: "Iterative decomposition of water and fat with echo asymmetry and least-squares estimation (IDEAL): application with fast spin-echo imaging", Magnetic Resonance in Medicine, John Wiley & Sons, Inc, US, vol. 54, No. 3, Aug. 9, 2005.

Houchun Harry Hu et al: "ISMRM workshop on fat-water separation: Insights, applications and progress in MRI", Magnetic Resonance in Medicine, vol. 68, No. 2, Jun. 12, 2012.

* cited by examiner

MR-BASED ATTENUATION CORRECTION IN PET/MR IMAGING WITH DIXON PULSE SEQUENCE

CROSS REFERENCE TO RELATED APPLICATIONS

This application is the U.S. National Phase application under 35 U.S.C. § 371 of International Application No. PCT/EP2014/069910, filed Sep. 18, 2014, published as WO 2015/040120 on Mar. 26, 2015, which claims the benefit of European Patent Application Number 13189802.5 filed Oct. 23, 2013 and claims the benefit of U.S. Provisional Patent Application No. 61/881,018 filed Sep. 23, 2013. These applications are hereby incorporated by reference herein.

FIELD OF THE INVENTION

The following relates generally to medical imaging. It finds particular application in conjunction with magnetic resonance (MR) imaging to provide attenuation correction for positron emission tomography (PET) imaging, and will be described with particular reference thereto. However, it will be understood that it also finds application in other usage scenarios and is not necessarily limited to the aforementioned application.

BACKGROUND OF THE INVENTION

In PET imaging, a subject is injected with a radiopharmaceutical which targets particular tissues typically through absorption based on a metabolic activity. As the radiopharmaceutical decays, positrons are emitted which annihilate in contact with an electron to form a pair of photons emitted 180° opposite along a line of response (LOR). The emitted gamma photons are recorded by PET detectors surrounding the subject. The locations of the annihilation events are computed from the recorded gamma photons which provide an image of the tissues targeted by the radiopharmaceutical. The emitted photons are affected by the density of tissues between the point of the annihilation event and the detector by either absorption or deflection. The recorded amount of radiopharmaceutical present in tissue is attenuated from the actual amount by the tissue density along the LORs. Correction for attenuation of PET image data seeks to accurately identify the tissue density at each voxel with an attenuation correction map for the subject being imaged.

Developing attenuation correction maps has been performed with X-ray radiation devices such CT scanners where recorded levels of X-ray radiation attenuation or transmission used to reconstruct images correlate strongly with tissue density. Newer techniques seek to use magnetic resonance systems (MR based attenuation correction—"MRAC") which avoid exposure of the subject to X-ray radiation. However, magnetic resonance imaging does not inherently differentiate tissue density.

Water and fat images are used to segment tissues for tissue classification. Current MR techniques, such as Dixon or mDixon, for concurrently obtaining water and fat images are typically optimized to produce the best possible spatial resolution in a given data acquisition time. In the Dixon technique, more fully described in U.S. Publication No. 2010/0052674, an in-phase image (0°) and an out-of-phase image (180°) are reconstructed from data collected at two echo times in a pulse sequence timed such that the phase difference between water and fat is usually 180° at the first echo time and 0° or (360°) at the second echo time. In the mDixon technique, more fully described in International Patent Application PCT/IB2010/050745, the constraints on the phase difference between water and fat at the first and at the second echo time are relaxed, allowing two arbitrary echo times with phase differences between water and fat other than 0° and 180°.

In the Dixon technique, long TRs (repetition times) may be experienced which results in long data acquisition times. For example, when imaging a station of a whole body image, the time needed to collect all data exceeds a typical subject's capability to hold his or her breath, leading to image artifacts induced by respiratory motion and thus in tissue misclassification in attenuation maps at a voxel level.

Typical PET systems provide a resolution of $\geq 2$ mm, whereas typical MR systems achieve a resolution of $\leq 1$ mm. In consequence, the MR system usually classifies each voxel of the tissue at a higher resolution in the attenuation map, which is then later aggregated, averaged, interpolated, etc. to map to the coarser resolution of the PET system to perform the attenuation correction.

SUMMARY OF THE INVENTION

The following discloses a new and improved MR timing optimization for MR based attenuation correction in PET/MR imaging which addresses the above referenced issues, and others.

In accordance with one aspect, a medical imaging system includes a nuclear imaging system, a timing optimization unit, a magnetic resonance (MR) scanner, an MR reconstruction unit, and an attenuation map unit. The nuclear imaging system receives nuclear decay data and generates at least one nuclear image of a first resolution based on the received nuclear decay data of an imaged subject and an attenuation map. The timing optimization unit which selects a first and a second echo time for a modified Dixon (mDixon) pulse sequence and a sufficient number of repetition times (TRs) to generate an image of the subject of at least the first resolution, with the phase angle difference between water and fat at the first and the second echo time being unequal to 0° and 180°. The MR scanner applies the sequence to the subject and receives MR data from the subject. The MR reconstruction unit reconstructs at least one MR image based on the MR data. The attenuation map unit constructs the attenuation map based on the reconstructed MR image.

In accordance with another aspect, a method of medical imaging includes receiving nuclear decay data and generating at least one image of a first resolution based on the received nuclear decay data of an imaged subject and an attenuation map. A first and a second echo time are selected for a modified Dixon (mDixon) pulse sequence, as well as a sufficient number of repetition times (TRs) to generate an image of the subject of at least the first resolution, with the phase angle difference between water and fat at the first and the second echo time being unequal to 0° and 180°. The mDixon pulse sequence is applied to a subject, and MR data are received from the subject. At least one anatomical MR image is reconstructed from the received MR data. The attenuation map is constructed based on the reconstructed at least one anatomical MR image.

In accordance with another aspect, a medical imaging system includes a magnetic resonance (MR) scanner, an MR reconstruction unit, an MR tissue classification unit, an attenuation map unit, and a PET reconstruction unit. The MR scanner applies a modified Dixon (mDixon) pulse sequence to a subject and receives MR data representing at least a portion of the subject at a selected first echo time and a selected second echo time, with the phase angle difference between water and fat at the first and the second echo time being unequal to 0° and 180°. The MR reconstruction unit reconstructs a water image and a fat image from the received MR data. The MR tissue classification unit classifies tissues based on the water image and the fat image. The attenuation map unit constructs an attenuation map based on the classified tissues and assigned attenuation values. The PET reconstruction unit registers the constructed attenuation map to the received nuclear decay data representing at least the portion of the subject and reconstructs at least one image based on the received nuclear decay data and the registered attenuation map.

In accordance with another, alternative aspect, a medical imaging system, includes a timing optimization unit configured to select i) a first echo time for a UTE (ultra-short echo-time) pulse sequence and a second echo time for a modified Dixon, mDixon, pulse sequence and ii) a sufficient number of repetition times to generate an a magnetic resonance, MR, image of the imaged subject of at least a first resolution, with the phase angle difference between water and fat at the second echo time being unequal to 180°.

In other words, in this alternative embodiment the UTE scheme is used for the first echo time and the mDixon scheme is used for the second echo time compared to the other embodiments mentioned earlier, where mDixon scheme is used for both echo times. In this "UTE+mDixon" embodiment, the phase angle difference between water and fat at the first echo time may be allowed to be substantially 0° whereas the phase angle of the second measurement is substantially different from 180° and 0°, respectively.

One advantage is minimizing or eliminating motion artifacts.

Another advantage resides in shorter TRs and data acquisition times.

Another advantage includes accurate attenuation corrected PET images.

Another advantage resides in flexibility in the choice of echo times. Another advantage resides in the ability to acquire MR data at one station within a patient's breath hold.

Another advantage includes the applicability to various MR scanner types.

Another advantage resides in elimination of signal cancellation, as occurring in out-of-phase images.

Some of the above advantages are achieved by making use of the flexible choice of the first and the second echo time in the mDixon technique that allows minimizing these echo times and the repetition time for any desired resolution of the MR image underlying the attenuation map. In particular, for a resolution larger than the resolution of PET systems (that is, a resolution large enough to resolve an anatomy of interest, eg cortical bone), the mDixon technique as used herein permits reducing echo times, repetition time, and thus scan time substantially compared to the Dixon technique, since the second echo time can be chosen much shorter than the first in-phase echo time. The mDixon technique allows dispensing with the requirement (as per the traditional Dixon technique) for the phase differences between water and fat to be approximately equal to 0° and 180° because this phase difference requirement often leads to widely spaced echo times and thus long repetition times of pulse sequences.

Also, using, in mDixon, phase differences other than 180° and/or 0° allows avoiding signal cancellations in voxels with fat and water components, which in turn allows constructing more accurate attenuation maps for MR based attenuation correction in PET.

As a further advantage of using the mDixon scheme as proposed herein, because the two echoes do not have to be exactly 0° and 180°, they can be spaced more closely together. This allows capturing even fast-decaying components (short T2*) which would have otherwise gone undetected in the traditional Dixon scheme by the time the second echo is acquired.

Still further advantages will be appreciated to those of ordinary skill in the art upon reading and understanding the following detailed description.

BRIEF DESCRIPTION OF THE DRAWINGS

The invention may take form in various components and arrangements of components, and in various steps and arrangement of steps. The drawings are only for purposes of illustrating the preferred embodiments and are not to be construed as limiting the invention.

DETAILED DESCRIPTION OF THE EMBODIMENTS

Figure 1:
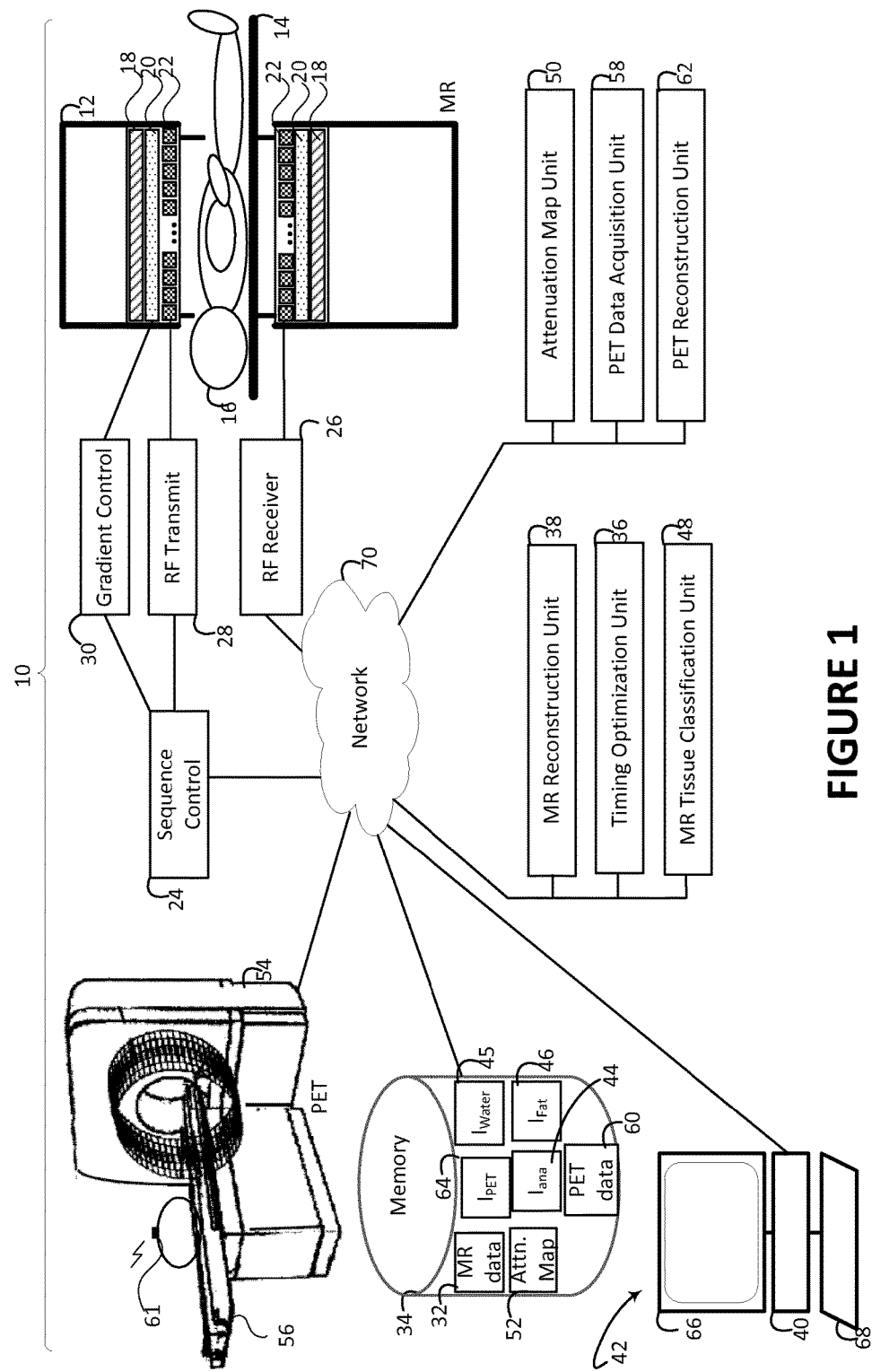
FIG. 1 schematically illustrates an embodiment of an MR/PET system with timing optimization and MR based PET attenuation correction maps.

With reference to FIG. 1, the MR/PET system 10 with timing optimization and MR based PET attenuation correction maps is schematically shown. The system 10 includes a MR scanner (or subsystem) 12 illustrated in partial cross section with a static $B_0$ main magnetic field such as a horizontal bore scanner, open system scanner, c-type scanner, vertical field scanner, hybrid scanner and the like. The MR scanner includes a subject support 14 such as a horizontal bed or couch which supports a subject 16 and moves the subject into the MR scanner bore, static main magnetic field, and field of view during imaging. The subject support moves the subject to one or more stations which positions pre-determine anatomical portions of the subject in the field of view for imaging. The MR scanner 14 includes a main magnet 18 which generates the static main magnetic field ($B_0$) such as a horizontal main magnetic field. The MR scanner further includes one or more gradient coils 20 for applying gradient magnetic fields, each of a particular area, strength, and timing to manipulate resonance in the tissues of the subject. The MR scanner includes one or more RF coils 22 which generate RF pulses to excite magnetic resonance in the subject 16 in a transmit mode and which can receive resonance signals from the subject in a receive mode. In some embodiments the RF coil 22 can include a local coil.

The system 10 includes a sequence controller 24 and a RF receiver unit 26. The sequence controller controls the operation of the imaging sequence which includes a RF transmitter unit 28 controlling the operation of the RF coils 22. A gradient controller 30 controls the operation of the gradient coils 20. The communication between the controlling unit and the corresponding coils can be wired or wireless. The sequence controller provides the instructions for the RF transmitter unit 28 and the gradient controller 30 to apply a selected mDixon pulse sequence to the subject. The RF receiver 26 receives MR data 32 which can be stored in storage 34, e.g. MR signals indicative of the magnetic resonance excited in the tissue of the subject. In one embodiment the sequence controller 24 is configured to apply ultra-short echo time sequences (UTE). UTE pulse sequences are characterized by having very short TEs (echo times) in the range of 0.05-0.20 milliseconds (ms). UTEs can be produced for instance (but this is not limiting) by use of half radiofrequency (rf) excitations with radial mapping from the center of k-space. In contrast, the echo times TE in an mDixon pulse sequence is longer than the UTE echo times, for instance 2.3 ms and 4.6 ms (at 1.5 T), but, again, these numbers are exemplary only and not limiting.

A timing optimization unit 36 selects a first echo time and a second echo time of the mDixon pulse sequence that minimizes or optimizes a repetition time (TR), with the phase angle difference between water and fat at the first and the second echo time being unequal to 0° and 180°. The water-fat phase angle of the first echo, $Q_1$, is selected such that the angle is greater than 0° or not exactly in-phase. The water-fat phase angle of the second echo, $Q_2$, is selected to minimize the difference of $Q_2-Q_1$ for the selected spatial resolution and the available gradient magnetic field strength and rise time of the MR scanner. As the phase difference $Q_2-Q_1$ is minimized, the TR is correspondingly shortened, which reduces the data acquisition time per station, preferably to within a breath hold to reduce respiratory motion artifacts. A typically breath hold is 15-20 seconds. For example, the first echo time can be selected to be less than 1.2 ms and the second echo time can be selected to be less than 2.0 ms, leading to a TR in the order of 3 ms. At static main magnetic field strengths of 1.5 T and 3 T, the second echo time is thus substantially shorter than the first in-phase echo time of 4.6 ms and 2.3 ms, respectively. Moreover, the increment in the phase angle difference between water and fat from the first to the second echo time is less than 180°, allowing an unambiguous resolution of a broader range of static main magnetic field strength offsets.

More particularly, according to one embodiment, phase angle differences between water and fat at the first and/or at the second echo time is substantially greater than 0° (eg, greater than 5°) and/or substantially less than 180° (eg, less than 175°), respectively. Said differently, it is proposed herein to harness the flexibilty afforded by the mDixon technique to explicitly avoid having phase differences close to 180° as such a phase difference may cause signal voids or signal cancellations for voxels with fat and water components (also referred to herein as "fat+water voxels") which in turn would compromise segmentation results as such fat+water voxels are commonly found at contours of body organs. In particular, it has been discovered by Applicant that a selection of echo times so as to achieve a phase difference (at the first or second echo time) of between 145°-155°, and in particular of 150°, has been shown to be of particular advantage for avoiding (or at least substantially mitigating) signal cancellation for fat+water voxels.

In an alternative embodiment (referred to herein as "UTE-mDIXON") it is proposed herein to combine the mDixon technique with a UTE pulse sequencing. In this embodiment, at the first echo time ("in-phase image" acquisition), a phase angle difference between water and fat of about 0° is allowed whereas the water and fat phase angle at the second echo time (out-of-phase image) is required to be substantially different from 180° and 0°, respectively, in particular, the phase angle at the second echo time is substantially less than 180° (eg 145°-155°) as above in the "pure" mDixon embodiment without UTE. Put differently, in this UTE-mDIXON embodiment as compared to the previous "mDixon only" embodiment, the mDixon sequence for the first echo time is replaced by an UTE pulse to acquire a UTE image.

The scan time, in one embodiment, is adapted to the patient. The time that the patient can hold his or her breath is estimated or measured. The scan time is set to this estimated or measured breath hold time. The number of repetitions is selected to provide sufficient data to reconstruct an image with a resolution at least as good as the resolution of the PET or other nuclear image. The timing optimization unit 36 calculates the first and the second echo time and the repetition time which optimize the phase angle differences between water and fat at the two echo times given the scan time constraint. If the echo times allow a higher spatial resolution of the MR image than of the PET image, the scan time can be shorted to reduce the breath hold times. If the patient's breath hold time is so short that acquiring an MR image with a resolution comparable to that of the PET image is impossible, then the data near the center of k-space, which is most sensitive to motion, is collected first during the breath hold and the data near the periphery of k-space, which is less sensitive to motion, is collected last or zero filled when motion becomes too great.

An MR reconstruction unit 38, embodied as a configured processor such as a processor 40 of a workstation 42, receives the RF data, e.g. the demodulated MR signals 32 from the RF receiver 26 and reconstructs at least one anatomical image 44 which differentiates water and fat. The processor can construct a separate water image 45 and fat image 46. The images can be stored in the memory 34 which can include local and/or solid state memory, local and/or remote disk storage, and the like. The memory can include a storage management system such as a Picture Archiving and Communication System (PACS), Departmental Radiology Information System (RIS), and the like.

An MR tissue classification unit 48 classifies tissues based on the anatomical image 44 with water and fat differentiation and/or the water image 45 and the fat image 46. The classifications are by voxel. The MR tissue classification unit 48 assigns attenuation values to the classified tissues. An MR anatomical image is generated in which regions attributable to water, fat, bone, and air are denoted and separated. The bone and air regions are differentiated and assigned attenuation values. The air and water regions represent soft tissue, the voxels of which are classified based on the relative amounts of water and fat and assigned a corresponding attenuation value. In this manner, various organs, muscles, tendons, and other soft tissues are assigned more accurate attenuation coefficients.

An attenuation map unit 50 constructs an attenuation map 52 based on the classified tissues and pre-assigned attenuation values for each type of tissue. The attenuation map 52 can be stored in the memory 34. The attenuation map is constructed using the anatomical image and/or water and fat images without respiratory motion artifacts, which improves the accuracy of the attenuation map. As, according to one embodiment, the phase angle difference (at at least one of the two echo times) is substantially different from 0° and/or from 180° so as to avoid signal cancellation in particular in fat+water voxels, the attenuation map can be produced with great fidelity which in turn allows increasing the fidelity of the PET imagery when using the attenuation map for correction as will be explained in more detail below. The system includes a PET scanner 54 which is shown as a separate unit for simplicity of illustration. Coupled PET and MR units which share the patient support are contemplated to reduce misalignment errors between the PET image and the MR attenuation map. A hybrid PET/MR system, e.g. an MR system with the gradient coil 20 split to define a gap adjacent the center of the examination region and the PET detectors disposed in the gap, enables the PET and MR data to be collected concurrently. Other nuclear imaging devices which utilize attenuation maps, such as Single Proton Emission Computed Tomography (SPECT) devices, are also contemplated. The data acquisition of the PET scanner (or nuclear medicine device) and MR scanner 12 can operate simultaneously or sequentially. The PET scanner 54 includes a subject support 56, preferably the same as the subject support 14. The PET scanner includes detectors located circumferentially around the examination region which receives the subject supported by the subject support 56. A PET data acquisition unit 58 receives nuclear decay data, e.g. detected gamma photon emissions from the subject in a field of view representing the portion of the subject corresponding to the portion represented in the attenuation map 52. The received nuclear decay data are recorded in list mode, in a data store 60. The list mode data are time stamped based on detection time. A respiration monitor 61 monitors the patient's respiration cycle and the respiration phase and time are recorded in the list mode data store. The nuclear imaging data can be temporally segmented based on respiratory phase, e.g. within a breath hold. In another embodiment, images in two or more respiration phases are generated and transformed into the breath hold phase. A PET reconstruction unit 62 reconstructs or generates one or more PET images 64 of the subject with the received nuclear decay data and the constructed attenuation map 52.

The workstation 42 includes the electronic processor or electronic processing device 40, a display 66, and at least one input device 68. The display displays the reconstructed MR images, reconstructed PET images, menus, panels, and user controls, and the like. The 'display' 66 or 'display device' as used herein encompasses an output device or a user interface adapted for displaying the images or data. A display may output visual, audio, and or tactile data. Examples of a display include, but are not limited to: a computer monitor, a television screen, a touch screen, a tactile electronic display, a Braille screen, a cathode ray tube (CRT), a storage tube, a bistable display, electronic paper, a vector display, a flat panel display, a vacuum fluorescent display (VF), a light-emitting diode (LED) display, an electroluminescent display (ELD), a plasma display panel (PDP), a liquid crystal display (LCD), an organic light-emitting diode display (OLED), a projector, and a head-mounted display. The input device 68 inputs healthcare practitioner selections. The workstation 42 can be a desktop computer, a laptop, a tablet, a mobile computing device, a smartphone, and the like. The input device 68 can be a keyboard, a mouse, a microphone, and the like. The various units 36, 38, 48, 50, 58, 62 are suitably embodied by an electronic data processing device, such as the electronic processor or electronic processing device 40 of the workstation 42, or by a network-based server computer operatively connected with the workstation 42 by a network 70, or so forth. Moreover, the reconstruction techniques, derivation techniques, and map construction are suitably implemented using a non-transitory storage medium storing instructions (e.g., software) readable by an electronic data processing device and executable by the electronic data processing device. The electronic processing device 40 can include a video processor which overlays the MR anatomical image 44, water image 45 and/or fat image 46 and the reconstructed PET image 64.

Figure 2:
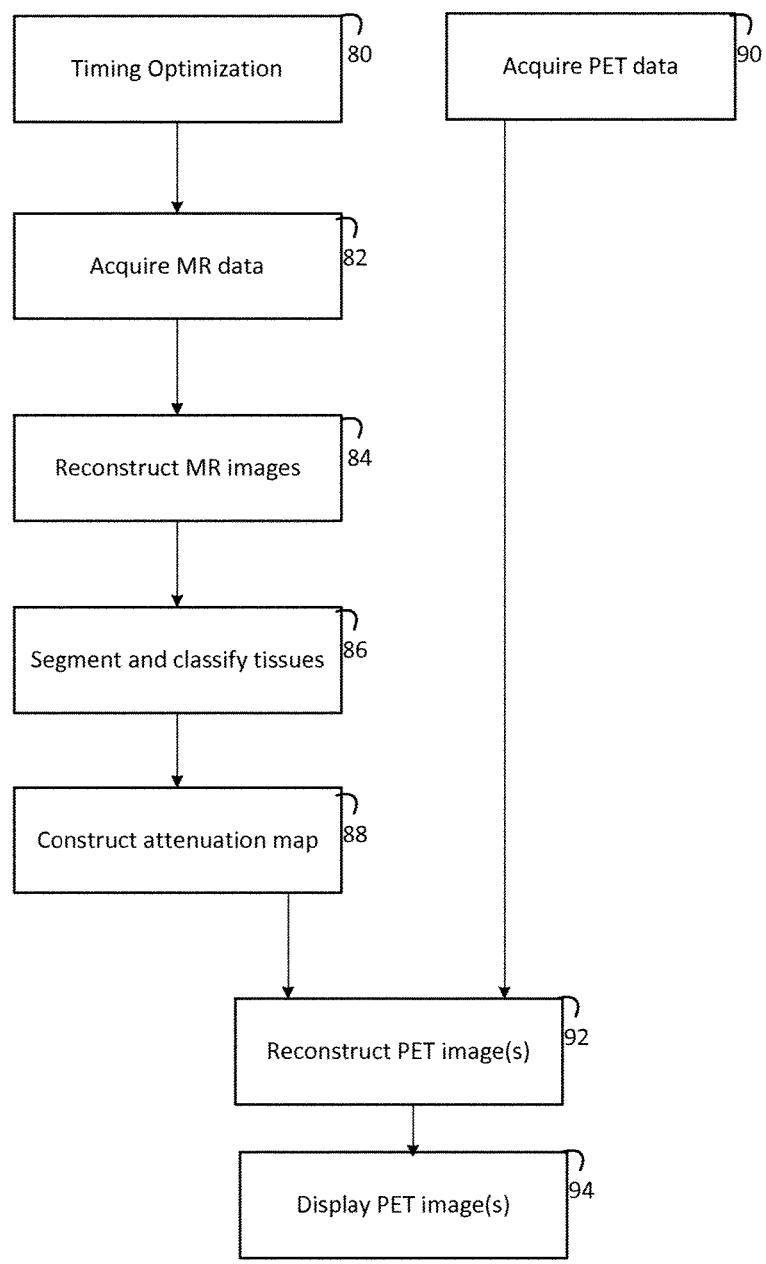
FIG. 2 flowcharts one method of using an embodiment of MR based attenuation correction with respiratory artifact reduction and/or signal cancellation avoidance.

With reference to FIG. 2, one method of using an embodiment of the MR based attenuation correction with respiratory artifact reduction is flowcharted. In a step 80, a first echo time and a second echo time of a modified Dixon (mDixon) pulse sequence are selected that minimize or optimize a repetition time (TR). In one embodiment, the scan time is adapted to the subject by being matched to the subject's breath hold capability while still having sufficient repetitions, e.g. TRs, to generate an image with a resolution as good as that of the PET image. The phase angle difference between water and fat at the first and the second echo time are optimized for the given TR and are unequal to 0° and 180°. In particular, the phase angle differences (at at least one of the two echo times, preferably at both) are substantially less than 180°, eg is less than 175°. In one embodiment, the phase angle difference is between 145°-155°. More particularly, in one embodiment the phase angle difference is approximately 150°. Also, the phase angle difference at at least one echo time is at least 90°. Said more generally, according to one embodiment, a phase angle difference (at at least one of the echo times, in one embodiment at both echo times) is ensured so as to substantially avoid signal cancellation for fat+water voxels. Specifically, in one embodiment, both the phase angles at the respective echo times are substantially different from 180° and 360° (or 0°), for instance the respective phase angle differences are about 150° (+/−10° or +/−15° or +/−20°) (eg for the second echo time) and/or are about 330° (+/−10° or +/−15° or +/−20°) (eg for the first echo time).

Alternatively, in the UTE-mDIXON embodiment where a UTE pulse sequence is used together with the mDixon technique, the phase angle difference of the first measurement (Free Induction Decay), that is at first echo time, may be allowed to be close to 0°, whilst the phase angle difference of the second measurement, that is at second echo time, would still be required to be substantially different from 180° and 0° (or 360°), respectively. For instance, the phase difference at the second measurement is ensured (as previously mentioned) to be about 150°, or at least to be in the range 150° (+/−10°) or 150° (+/−20°). Using UTE pulse sequencing with mDixon in this manner allows distinguishing rapid signal decay due to very short T2*, as in bone structures, from water-fat de-phasing and potential signal cancellation.

The mDixon pulse sequence is applied to the subject and MR data representing at least a portion of the subject are received in a step 82. In one embodiment the MR data is representative of a 3D portion of the subject as MR scanning in a 3D portion allows a more accurate reconstruction of the attenuation map at step 88 below. The pulse sequence can be applied during a breath hold of the subject positioned at a predetermined position or station within the MR scanner. For example, first and second echo times of 2 ms or less can be applied using a 1.5 T or 3 T MR scanner.

In a step 84, the received MR data are reconstructed into at least an anatomical image in which water and fat are differentiated based on the phase angle differences between water and fat at the first and second echo time. Tissues are segmented and classified based on the reconstructed anatomical image in a step 86. Voxels corresponding to bone, air, and soft tissue are identified. Based on the relative water and fat content of each soft tissue voxel, the soft tissue voxels are further classified. Attenuation values are assigned to the classified tissue in each voxel. An attenuation map is constructed in a step 88.

Simultaneously or sequentially in a step 90, nuclear imaging or PET data are acquired for the portion of the subject's anatomy corresponding to the MR data, e.g. in the same field of view. The nuclear decay data are generated from gamma photon emissions detected from the portion of the subject in the detector region of the PET scanner. The data can be acquired during a breath hold and/or mapped or registered to the attenuation map. The acquired PET data and the constructed attenuation map are used to reconstruct one or more PET images in a step 92. The reconstructed PET image can include an overlay of the MR anatomical image. The reconstructed PET image can include an overlap display of the classified tissues. The image can be displayed by the display device and/or stored in the memory for later retrieval and display and/or analysis in a step 94. A non-transitory computer-readable storage medium carrying software can be used which controls one or more electronic data processing devices or processors 40 to perform the steps described.

It will be appreciated that the order of above steps may vary. For instance, the acquisition of the nuclear imaging (eg PET) data at step 90 may occur at any stage before step 92.

According to one embodiment, the mDixon method with the two echo times is supplemented by an additional readout with an ultra-short echo time (UTE) acquired prior to the two echoes acquired for the mDIXON reconstruction. This additional echo encodes signals from solid species such as cortical bone, which is particularly beneficial for the calculation of the attenuation map.

The systems and related methods as proposed herein may be used in any form of nuclear medicine not merely PET (eg SPECT, and radiation therapy are also envisaged), where MR image data are available and are to be used for attenuation correction purposes. The systems and related methods are particularly useful for generation of whole-body attenuation maps, which (at least partially) require data acquisition during breath holding. It is also useful in the context of integrated PET/MR systems as shown above as it imposes less stringent requirements on the MR gradient system.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

The invention claimed is:

1. A medical imaging system, comprising:
a timing optimization unit configured to select i) a first echo time and a second echo time for a modified Dixon (mDixon) pulse sequence and ii) a sufficient number of repetition times to generate a magnetic resonance (MR) image of the imaged subject of at least a first resolution, with the phase angle difference between water and fat at each of the first echo time and the second echo time being unequal to 0° and 180°;
a MR scanner configured to apply the selected mDixon pulse sequence to the subject and to receive MR data from the subject, the MR scanner comprising i) a gradient control configured to control application of one or more gradient magnetic fields to produce a first and a second echo at the first and the second echo time and ii) one or more gradient coils configured to apply a gradient field to the subject;
an MR reconstruction unit configured to reconstruct the at least one MR image based on the MR data;
an MR classification unit configured to segment and/or classify tissues based on the reconstructed at least one MR image;
an attenuation map unit configured to construct the attenuation map based on the segmented and classified tissues of the at least one MR image; and
a nuclear imaging system configured to receive nuclear decay data and to generate at least one nuclear image of the first resolution based on the received nuclear decay data from an imaged subject and the attenuation map, wherein the generating of the nuclear image includes registering the attenuation map to the received nuclear decay data.

2. The system according to claim 1, wherein the first echo time and the second echo time are each less than 2.0 ms at 3 T or less than 4.0 ms at 1.5 T.

3. The system according to claim 1, wherein the number of repetition times define a scan time per station less than or equal to a breath hold duration of the imaged subject.

4. The system according to claim 1, wherein the phase angle difference between water and fat at the first and the second echo time is so as to avoid signal cancellation in a voxel with fat and water components.

5. The system according to claim 1, wherein the phase angle difference between water and fat at at least one of the first and the second echo time is in the range of 150°+/−10° or +/−20° or +/−25°.

6. The system according to claim 1, wherein the nuclear imaging system includes:
a PET scanner configured to generate the at least one nuclear image from gamma photon emissions detected from the subject.

7. The system according to claim 1, further including:
a video processor configured to overlay the generated at least one nuclear image and the at least one MR image.

8. The system according to claim 1, further including:
a display device configured to display the generated nuclear image.

9. The system according to claim 1, further including a video processor configured to overlay the segmented and classified tissue and the generated at least one nuclear image.

10. A non-transitory computer-readable storage medium carrying software which controls one or more electronic data processing devices to perform a method of medical imaging, the method comprising:
selecting a first echo time and a second echo time for a modified Dixon (mDixon) pulse sequence and a sufficient number of repetition times (TRs) to generate an image of the subject of at least a first resolution, with the phase angle difference between water and fat at each of the first echo time and the second echo time being unequal to 0° and 180°;
applying the mDixon pulse sequence to a subject and receiving magnetic resonance (MR) data from the subject, wherein the applying includes controlling the application of one or more gradient magnetic fields to produce a first and a second echo at the first and the second echo time;
reconstructing at least one anatomical MR image from the received MR data;
segmenting and/or classifying tissues based on the reconstructed at least one MR image;
constructing an attenuation map based on the segmented and/or classified tissues;
receiving nuclear decay data of the imaged subject;
registering the constructed attenuation map to the received nuclear decay data;
generating at least one image of the first resolution based on the received nuclear decay data and the attenuation map.

11. The non-transitory computer-readable storage medium according to claim 10, wherein the first echo time and the second echo time each are less than 2.0 ms at 3 T or less than 4.0 ms at 1.5 T.

12. The non-transitory computer-readable storage medium according to claim 10, wherein receiving further includes:
generating nuclear decay data from gamma photon emissions detected from the subject.

13. The non-transitory computer-readable storage medium according to claim 10, wherein generating further includes:
overlaying the reconstructed PET image and the reconstructed at least one anatomical MR image.

14. The non-transitory computer-readable storage medium according to claim 10, wherein the number of repetition times define a scan time per station less than or equal to a breath hold duration of the imaged subject.

15. A medical imaging system, comprising:
a magnetic resonance (MR) scanner configured to apply a modified Dixon (mDixon) pulse sequence to a subject and to receive MR data representing at least a portion of the subject at a selected first echo time and a selected second echo time, with the phase angle difference between water and fat at each of the first echo time and the second echo time being unequal to 0° and 180°;
an MR reconstruction unit configured to reconstruct a water image and a fat image from the received MR data; and an MR tissue classification unit configured to classify tissues based on the water image and the fat image;
an attenuation map unit configured to construct an attenuation map based on the classified tissues and assigned attenuation values; and
a PET reconstruction unit configured to register the constructed attenuation map to the received nuclear decay data representing at least the portion of the subject and to reconstruct at least one image based on the received nuclear decay data and the registered attenuation map.

16. A medical imaging system, comprising:
a timing optimization unit configured to select i) a first echo time for an ultra-short echo time (UTE) pulse sequence with an echo time of 0.20 milliseconds or less and a second echo time for a modified Dixon (mDixon) pulse sequence and ii) a sufficient number of repetition times to generate an a magnetic resonance (MR) image of the imaged subject of at least a first resolution, with the phase angle difference between water and fat at the second echo time being unequal to 180°;
a MR scanner configured to apply the selected mDixon pulse sequence to the subject and to receive MR data from the subject, the MR scanner comprising i) a gradient control configured to control application of one or more gradient magnetic fields to produce a first and a second echo at the first and the second echo time and ii) one or more gradient coils configured to apply a gradient field to the subject;
an MR reconstruction unit configured to reconstruct at least one MR image based on the MR data;
an MR classification unit configured to segment and classify tissues based on the reconstructed at least one MR image;
an attenuation map unit configured to construct the attenuation map based on the segmented and classified tissues of the at least one MR image; and
a nuclear imaging system configured to receive nuclear decay data and to generate at least one nuclear image of the first resolution based on the received nuclear decay data from an imaged subject and the attenuation map, wherein generating of the nuclear image includes registering the attenuation map to the received nuclear decay data.

17. The system according to claim 15, wherein the phase angle difference between water and fat at at least one of the first and the second echo time is in the range of 150°+/−10° or +/−20° or +/−25°.

18. The system according to claim 15, further including:
a video processor configured to at least one of:
overlay the generated at least one nuclear image and the at least one MR image; and
overlay the segmented and classified tissue and the generated at least one nuclear image.

19. The system according to claim 16, wherein the phase angle difference between water and fat at at least one of the first and the second echo time is in the range of 150°+/−10° or +/−20° or +/−25°.

20. The system according to claim 16, further including:
a video processor configured to at least one of:
overlay the generated at least one nuclear image and the at least one MR image; and
overlay the segmented and classified tissue and the generated at least one nuclear image.

* * * * *